(12) United States Patent
Wezelenburg et al.

(10) Patent No.: US 8,381,083 B2
(45) Date of Patent: Feb. 19, 2013

(54) ERROR CONTROL CODING FOR SINGLE ERROR CORRECTION AND DOUBLE ERROR DETECTION

(75) Inventors: Martinus Cornelis Wezelenburg, Keasel-Lo (BE); Thomas Kelshaw Conway, Cambridge (GB)

(73) Assignee: ARM Limited, Cambridge (GB)

( * ) Notice: Subject to any disclaimer, the term of this patent is extended or adjusted under 35 U.S.C. 154(b) by 561 days.

(21) Appl. No.: 12/588,665

(22) Filed: Oct. 22, 2009

(65) Prior Publication Data
US 2011/0099451 A1 Apr. 28, 2011

(51) Int. Cl.
*G06F 11/00* (2006.01)
(52) U.S. Cl. .......... 714/785; 714/781; 714/777
(58) Field of Classification Search .......... 714/752, 714/777, 781, 785
See application file for complete search history.

(56) References Cited

U.S. PATENT DOCUMENTS

| | | | | |
|---|---|---|---|---|
| 5,923,680 | A * | 7/1999 | Brueckheimer et al. | 714/758 |
| 7,278,085 | B1 * | 10/2007 | Weng et al. | 714/766 |
| 2003/0061562 | A1 * | 3/2003 | Ishiwatari et al. | 714/777 |
| 2008/0163032 | A1 * | 7/2008 | Lastras-Montano | 714/785 |
| 2009/0313529 | A1 * | 12/2009 | Goma et al. | 714/777 |
| 2010/0241933 | A1 * | 9/2010 | Latremouille | 714/785 |

* cited by examiner

*Primary Examiner* — Marc Duncan
(74) *Attorney, Agent, or Firm* — Nixon & Vanderhye P.C.

(57) ABSTRACT

An error correction coding is provided that generates P bits of check data from K M-bit words of payload data. The P bits of check data include an address field A, a bit error indicating field E and an auxiliary field P−(E+A). The address field encodes a set of error addresses which has a cardinality equal to the bit size K of the payload data and providing a one-to-one mapping between values of the address field and the locations of a single bit error within the payload data. The bit error indicating field indicates if a bit error is present. The auxiliary field is a minimum size bit vector such that together with the address field and the bit area indicating field it provides a checksum for a systematic code for the payload data with a minimum Hamming distance serving to provide either single error correction capability or single error correction and double error detection capability.

33 Claims, 5 Drawing Sheets

ERROR CONTROL CODING FOR SINGLE ERROR CORRECTION AND DOUBLE ERROR DETECTION

BACKGROUND OF THE INVENTION

1. Field of the Invention

This invention relates to the field of data processing systems. More particularly, this invention relates to the field of error correcting and error detecting mechanisms within data processing systems.

2. Description of the Prior Art

It is known to provide Error Control Coding (ECC) for use in association with blocks of data. The blocks of data may be stored within a memory, transmitted across a data path or subject to some other action which can result in one or more bit errors within the block of data. The error correcting and/or error detecting codes associated with the block of data may provide a variety of different capabilities for correcting and/or detecting bit errors within the block of data. A simple parity bit may serve to detect a single bit error, but have no capability for correcting a hard bit error. More sophisticated error control codes may be capable of detecting and correcting one or more bit errors within a block of data.

Although the action of error correction and error detection is desirable, there is an additional overhead associated with storing, writing, reading, transmitting etc the error control codes in association with the data block. Furthermore, the processing required to use the error control codes to identify and/or detect the bit errors represents an overhead in terms of the circuitry required and/or additional latency which may be involved in accessing a block of data.

SUMMARY OF THE INVENTION

Viewed from one aspect the present invention provides apparatus for decoding data comprising:

receiving circuitry configured to receive a block of data formed of K M-bit words of payload data and P bits of received check data;

check calculating circuitry configured to calculate P bits of calculated check data in dependence upon said K M-bit words of payload data;

syndrome generating circuitry responsive to said received check data and said calculated check data to generated a syndrome value; and repair circuitry responsive to said syndrome value to detect a bit error in said K M-bit words of payload data and to repair said bit error in said K M-bit words of payload data; wherein said P bits of check data and said syndrome value have an address field of A bits, a bit error indicating field of E bits and an auxiliary field of (P−(A+E)) bits;

said bit error indicating field indicates if said bit error is present and a position of said bit error within an M-bit word;

said address field encodes a set of error addresses which has a cardinality of K providing a one-to-one mapping between values of said address field and a location of said M-bit word having said bit error within said K M-bit words of said payload data;

said auxiliary field is a bit vector such that together with said address field and said bit error indicating field it provides a checksum for a systematic code with a minimum Hamming distance of T, where T is given by one of T=3 to provide single error correction capability and T=4 to provide single error correction and double error detection capability;

said repair circuitry has error location determining circuitry responsive to said address field to identify an M-bit word containing a bit error within said payload data and responsive to said bit error indicating field to identify the location of said bit error within said M-bit word and bit repair circuitry responsive to said error location determining circuitry to repair said bit error at said location;

said repair circuitry is responsive to said syndrome value to detect a bit error in said P bits of check data and to repair said bit error in said P bits of check data; and said repair circuitry responsive to said address field, said bit error indicating field and said auxiliary field to determine whether said address field and said bit error indicating field are valid.

The present technique recognises that by using check data incorporating an address field which encodes a set of addresses with a cardinality sufficient to provide a one-to-one mapping to a location of the M-bit word having the bit error it is possible to reduce the circuitry and latency overhead associated with identifying the location of the M-bit word that has the bit error. Furthermore, in combination with the bit error indicating field and the auxiliary field within the check data it is possible to provide a checksum for a systematic code for a minimum Hamming distance of one of (a) three in order to provide signal error correction capability, or (b) four in order to provide single error correction and double error detection capability, whilst keeping the size of the check data low thereby reducing the overhead associated with the storage and manipulation of the check data, e.g. memory capacity used in storing check data, transmission bandwidth consumed by transmitting check data etc.

It will be appreciated that the block of data could have a variety of different sizes. When the block of data has a size $K=2^n$ words, then the address field can have a bit length A that is equal to n.

The size of the address field A is not reduced until the size of the block of data is reduced to the next lowest power of two below as there is no reduction in the address size until such a reduction in the size of the data block is reached.

In a general case the codes of the present technique need not be minimum size codes required to provide (single Error Correct Double Error Detect (SECDED) capabilities. However, there are efficiency gains when minimum size codes are used as below.

The size of the checked data required in order to provide sufficient auxiliary data to give the necessary correction/detection capabilities can vary. Efficient embodiments are those in which when $M=2^m$ and M<4 the total size of the check data P is given by m+n+3 when the repair circuitry is to provide single error repair and double error detect capability for a data block size $2^n$. One bit of check data can be saved if only a single error repair capability is required, thus the size of the check data P being m+n+2. If the word size M>=4, then the check data size for single error repair capability is P=m+n+1 and for single error correct and double error correct capability is p=m+n+2.

If the data block size is smaller than $2^n$ but more than $2^{(n-1)}$, then the single error repair capability can be provided with a check data size of n+1 and the single error repair and double error detection capability can be provided with a check data size of n+2.

Embodiments of the decoder may be efficiently provided utilising double error detection circuitry operating in parallel with error location determining circuitry and bit repair circuitry. These circuit elements being disposed in parallel permits a reduced latency associated with the processing of the check data.

The error location determining circuitry can be provided to generate a M-bit mask with one non-zero bit from the bit error indicating field with the bit repair circuitry then performing an XOR operation of this M-bit mask upon the M-bit word indicated by the address field within the payload data in order to repair the bit error. As an alternative a K×M bit mask may be generated from the bit error indicating field and the address field and applied to the payload data to repair the bit error.

It will be appreciated that the M-bit words could have a range of word lengths. In some embodiments M=1.

As well as detecting errors within the payload data, some embodiments include check data detecting circuitry disposed in parallel with the error location determining circuitry and the bit repair circuitry. This check data detecting circuitry may be responsive to the syndrome value to detect a bit error within the received check data as it is also possible for errors to occur within the check data and these should not produce erroneous operation.

It will be appreciated that the address field may encode a set of addresses with a cardinality of K and provide a one-to-one mapping between values of the address field and locations of a single bit error within the payload data in a variety of different ways. As an example, it is possible that the address field could be Gray coded. However, simple and efficient embodiments are those in which the address field is a direct linear representation of the location of the bit error within the payload data or alternatively the location of the M-bit word including the bit error.

Another form of embodiment is one in which the check calculating circuitry is formed at least partially to recursively calculate the calculated check data for the (K*M) bits of payload data by calculating portion check data for two disjoint (K*M)/2 bit portions of the payload data and then combining these portions of check data to form the calculated check data.

Viewed from another aspect the present invention provides an apparatus for decoding data comprising:

receiving means for receiving a block of data formed of K M-bit words of payload data and P bits of received check data;

check calculating means for calculating P bits of calculated check data in dependence upon said K M-bit words of payload data;

syndrome generating means responsive to said received check data and said calculated check data for generating a syndrome value; and repair means responsive to said syndrome value for detecting a bit error in said K bits of payload data and for repairing said bit error in said K M-bit words of payload data; wherein said P bits of check data and said syndrome value an address field of A bits, a bit error indicating field of E bits and an auxiliary field of (P−(A+E)) bits;

said bit error indicating field indicates if said bit error is present;

said address field encodes a set of error addresses which has a cardinality of K providing a one-to-one mapping between values of said address field and a location of said M-bit word having said bit error within said K M-bit word of said payload data;

said auxiliary field is a bit vector such that together with said address field and said bit error indicating field it provides a checksum for a systematic code with a minimum Hamming distance of T, where T is given by one of T=3 to provide single error correction capability and T=4 to provide single error correction and double error detection capability;

said repair means has error location determining means responsive to said address field for identifying an M-bit word containing a bit error within said payload data and responsive to said bit error indicating field to identify a location of said bit error within said M-bit word and bit repair means responsive to said error location determining circuitry for repairing said bit error at said location;

said repair means is responsive to said syndrome value to detect a bit error in said P bits of check data and to repair said bit error in said P bits of check data; and said repair means is responsive to said address field, said bit error indicating field and said auxiliary field to determine whether said address field and said bit error indicating field are valid.

Viewed from a further aspect the present invention provides a method of decoding data, said method comprising the steps of:

receiving a block of data formed of K M-bit words of payload data and P bits of received check data;

calculating P bits of calculated check data in dependence upon said K M-bit words of payload data;

in response to said received check data and said calculated check data, generating a syndrome value; and in response to said syndrome value, detecting a bit error in said K M-bit words of payload data and repairing said bit error in said K M-bit words of payload data; wherein said P bits of check data and said syndrome value have an address field of A bits, a bit error indicating field of E bits and an auxiliary field of (P−(A+E)) bits;

said bit error indicating field indicates if said bit error is present and a position of said bit error within an M-bit word;

said address field encodes a set of error addresses which has a cardinality of K providing a one-to-one mapping between values of said address field and a location of said M-bit word having said bit error within said K M-bit words of said payload data;

said auxiliary field is a bit vector such that together with said address field and said bit error indicating field it provides a checksum for a systematic code with a minimum Hamming distance of T, where T is given by one of T=3 to provide single error correction capability and T=4 to provide single error correction and double error detection capability;

in response to said address field, identifying an M-bit word containing a bit error within said payload data and in response to said bit error indicating field identifying a location of said bit error within said M-bit word and response to said location repairing said bit error at said location;

in response to said syndrome value, detecting a bit error in said P bits of check data and repairing said bit error in said P bits of check data; and in response to said address field, said bit error indicating field and said auxiliary field, determining whether said address field and said bit error indicating field are valid.

Viewed from a complementary aspect the present invention provides an apparatus for encoding data comprising:

receiving circuitry configured to receive K M-bit words of payload data;

check calculating circuitry configured to calculate P bits of check data in dependence upon said K M-bit words of payload data; and block forming circuitry configured to form a block of data comprising said K M-bit words of payload data and said P bits of check data; wherein said P bits of check data and said syndrome value an address field of A bits, a bit error indicating field of E bits and an auxiliary field of (P−(A+E)) bits;

said bit error indicating field indicates if bit error is present and a position of said bit error within an M-bit word;

said address field encodes a set of error addresses which has a cardinality of K providing a one-to-one mapping between values of said address field and a location of said M-bit word having said bit error within said K M-bit words of said payload data;

said auxiliary field is a bit size such that together with said address field and said bit error indicating field it provides a checksum for a systematic code with a minimum Hamming distance of T, where T is given by one of T=3 to provide single error correction capability and T=4 to provide single error correction and double error detection capability.

The advantages of compact check data representation with good error correction/detection capabilities combined with the ability to provide a low overhead implementation and a low latency or pipelined implementation is also useful within the encoder for forming the check data from a block of data prior to its storage, transmission etc.

Viewed from a further complementary aspect the present invention provides an apparatus for encoding data comprising:

receiving means for receiving K M-bit words of payload data;

check calculating means for calculating P bits of check data in dependence upon said K M-bit words of payload data; and block forming means for forming a block of data comprising said K M-bit words of payload data and said P bits of check data; wherein said P bits of check data and said syndrome value have an address field of A bits, a bit error indicating field of E bits and an auxiliary field of (P−(A+E)) bits;

said bit error indicating field indicates if said bit error is present;

said address field encodes a set of error addresses which has a cardinality of K providing a one-to-one mapping between values of said address field and a location of said M-bit word having said bit error within said K M-bit words of said payload data;

said auxiliary field has a bit size that together with said address field and said bit error indicating field provides a minimum Hamming distance of T between instances of parity error data corresponding to error free payload data, where T is given by one of T=3 to provide single error correction capability and T=4 to provide single error correction and double error detection capability.

Viewed from a further complementary aspect the present invention provides a method of encoding data, said method comprising the steps of receiving K M-bit words of payload data;

calculating P bits of check data in dependence upon said K M-bit words of payload data; and forming a block of data comprising said K M-bit words of payload data and said P bits of check data; wherein said P bits of check data and said syndrome value have an address field of A bits, a bit error indicating field of E bits and an auxiliary field of (P−(A+E)) bits;

said bit error indicating field indicates if said bit error is present and a position of said bit error within an M-bit word;

said address field encodes a set of error addresses which has a cardinality of K providing a one-to-one mapping between values of said address field and a location of said M-bit word having said bit error within said M-bit words of said payload data;

said auxiliary field has a bit size that together with said address field and said bit error indicating field provides a minimum Hamming distance of T between instances of check data corresponding to error free payload data, where T is given by one of T=3 to provide single error correction capability and T=4 to provide single error correction and double error detection capability.

The present techniques may also be provided for use within embodiments the payload data is divided into M-bit words of payload data with the address field identifying which M-bit word contains the error.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
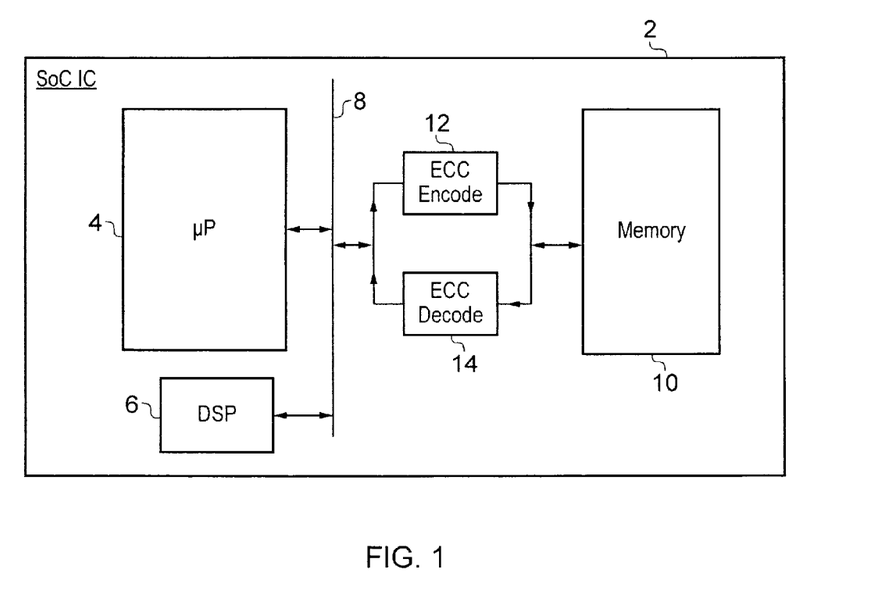
FIG. 1 schematically illustrates a system-on-chip integrated circuit using error correction coding upon stored data within a memory.

FIG. 1 schematically illustrates a system-on-chip integrated circuit 2 including a processor core 4 and a digital signal processor 6 connected via a system bus 8 to a memory 10. An Error Control Code (ECC) encoder 12 is disposed in the write path to the memory 10. An Error Control Code decoder 14 is disposed in the read path from the memory 10. It will be appreciated that in practice the ECC decoder 14 may contain circuitry that can also serve as the ECC encoder 12 and thus duplication of this hardware resource an be avoided. In FIG. 1 the ECC encoder 12 and the ECC decoder 14 are separately shown for the sake of simplicity.

When a block of payload data is written by the processor core 4 or the digital processor 6 to the memory 10, then it passes through the ECC encoder 12 where it is processed and check data added to the payload data. When a block of data is read from the memory 10, it passes through the ECC decoder 14 where the check data is recalculated and compared with the check data stored as the block of data was written into the memory 10. If the calculated check data and the stored check data do not match, then the ECC decoder 14 uses the differences between the stored check data and the newly calculated check data to perform single error correction and double error detection upon the payload data.

Figure 2:
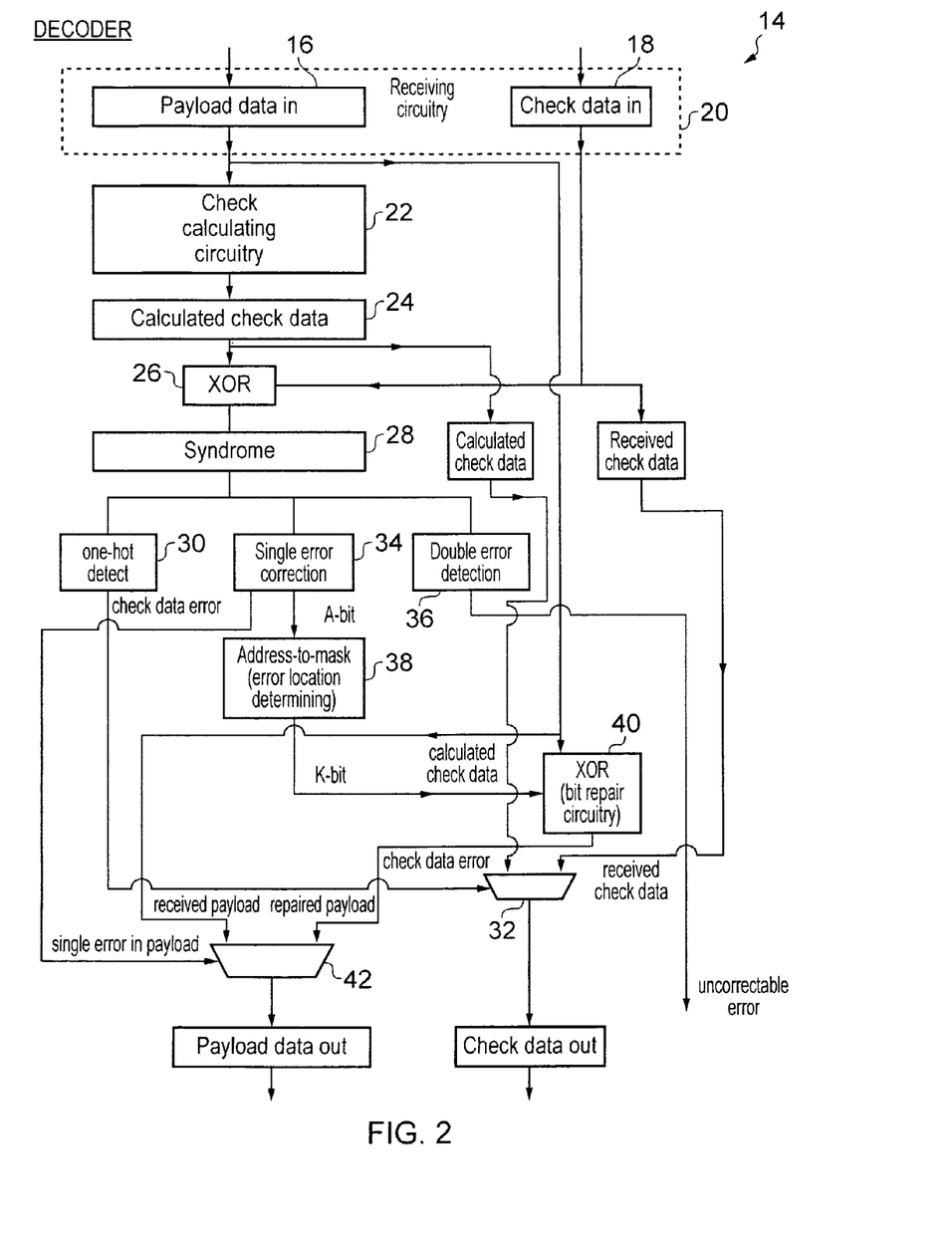
FIG. 2 schematically illustrates decoder circuitry for performing single error correction and double error detection upon a block of payload data.

FIG. 2 schematically illustrates the decoder 14 in more detail. A block of payload data (e.g. a block of 4096 bits, with M=1 and K=4096) is received in a payload data in register 16. This payload data can more generally be considered to be arranged into M-bit words. Corresponding check data for the block of payload data is received into a check data in register 18. The payload data in register 16 and the checked data in register 18 together form receiving circuitry 20. In this case, the block of payload data is 4096 bits in length and accordingly K=4096. 4096 is equal to $2^{12}$ and accordingly 12 bits of data are required to provide the address of an error bit within the payload data. An address field of A bits provided within the check data is used to address the bit error position. Accordingly, with this block size for the payload data the address field is 12 bits in length and A=12. Check calculating circuitry 22 receives the payload data from the payload data in register 16 and calculates check data therefrom in accordance with the same technique that calculated the check data which has been received into the check data in register 18. The calculated check data is stored within a calculated check data register 24. Thus, the check data in register 18 stores P bits of received checked data and the calculated check data register 24 stores P bits of calculated check data. If the payload data is error free, then the received checked data and the calculated check data will match.

XOR circuitry 26 receives the calculated check data and the received check data and performs an XOR operation thereupon to identify any bits within the two forms of the check data which do not match. The XOR circuitry 26 performs the role of syndrome generating circuitry and the value it outputs is stored within a syndrome register 28. The syndrome value characterises the nature of the error present within the received data. The forms of error present include a single bit error which is correctable, a double bit error which is detectable, but not correctable, and an error within the check data.

A one-hot detector 30 serves as check data detecting circuitry and identifies if the check data has an error. If more than one bit is non-zero within the syndrome value, then this indicates that the check data is in error. If the check data is in error, then a multiplexer 32 selects the calculated check data from the calculated check data register 24 for further output from the decoder as the received check data contains a bit error.

Also responsive to the syndrome value and in parallel with the check data detecting circuitry there are provided single error correction circuitry 34 and double error detection circuitry 36. As will be discussed later, the check data includes an auxiliary filed with a bit size sufficient to ensure a Hamming distance which can provide single error correction and double error detection in this example embodiment. If the syndrome value is indicative of a double error, then the double error detection circuitry 36 generates an uncorrectable error to signal which is output from the decoder. If the syndrome value is indicative of a single error, then the single error correction circuitry 34 extracts from the syndrome value an A-bit address of the bit error within the payload data. Address-to-mask circuitry 38 receives the A-bit error address and converts this into a *K*M)-bit mask value for application to the received payload data. The mask value has a non-zero bit with a position corresponding to the location of the bit error within the received payload data. Bit repair circuitry 40 is responsive to this one-hot mask value and the received payload data to invert the value for the bit location where the bit error has been detected and accordingly repair the bit error. The single error correction circuitry 34 controls a multiplexer 42 to select either the repaired payload data or the received payload data for output from the decoder 14.

The address may alternatively identify an M-bit word within the K M-bit words of payload data with the bit error indicating field part of the syndrome value giving both the presence of an error in this word and to indicate the bit position within the M-bit word. The check data may be recursively calculated by dividing the payload data, calculating two portions of check data and then combining those portions. In this alternative case, the block of payload data is 4096 bits in length with M=8 and accordingly K=512. 512 is equal to $2^9$ and accordingly 9 bits of data are required to provide the address of an 8-=bit word within the payload data that contains a bit error. In this case the required number of check bits gives P=14.

Figure 3:
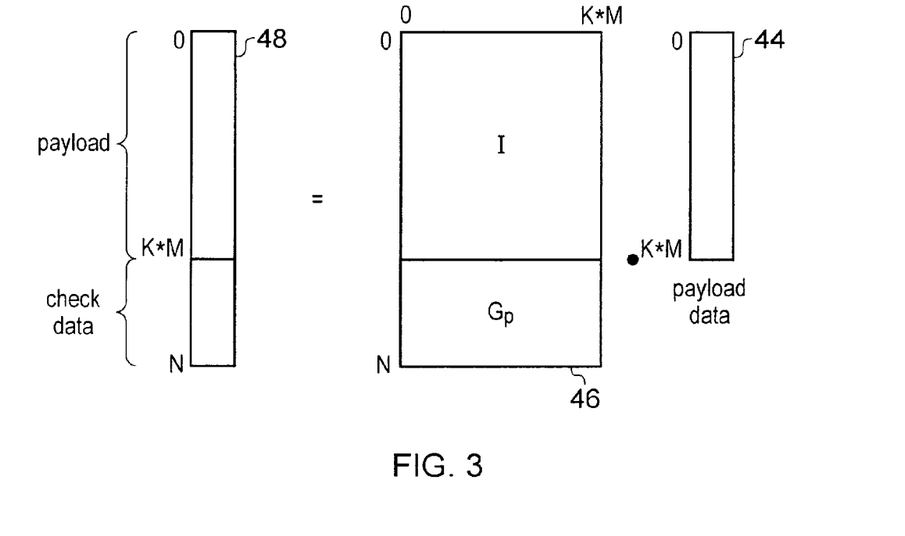
FIG. 3 schematically illustrates a matrix arithmetic operation for forming a systematic codeword from payload data.

FIG. 3 schematically illustrates a matrix arithmetic operation performed by the check calculating circuitry 22. The (K*M) bits of payload data 44 is subject to a matrix multiplication by a matrix operator 46. The matrix operator 46 is a (K*M) by N matrix. The upper portion of this matrix is the identity matrix I which regenerates the payload data within the result 48. A check data generating portion Gp of the matrix 46 acts upon the payload data 44 and generates the check data. The check data comprises P bits of calculated check data. Accordingly, N=(K*M)+P.

The general form of operation of check calculating circuitry 22 performing matrix multiplication operations will be familiar to those in this technical field. The form of the check data generating portion Gp of the matrix 46 provides the check data in a form permitting low overhead (in terms of circuitry and latency) extraction of the bit error location while permitting either a single error correction capability, or if desired a single error correction and double error detection capability, with a small check data size thereby increasing storage, transmission etc efficiency.

Figure 4:
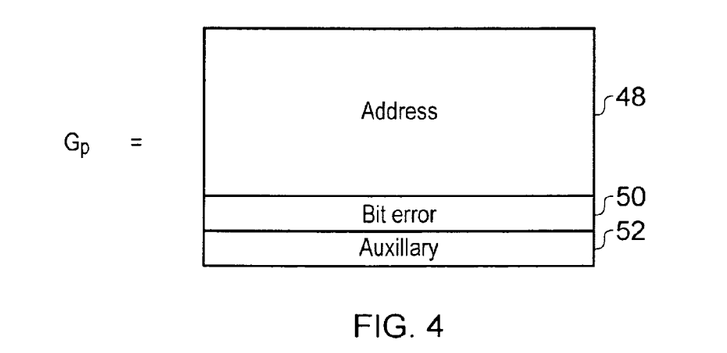
FIG. 4 schematically illustrates a portion of the operator matrix of FIG. 3 that generates the check data.

FIG. 4 illustrates the check data generating portion Gp of the matrix 46 in more detail. In particular, this portion of the matrix 46 includes address generating rows 48 which serve to form an address field of A bits with the check data. The address field encodes a set of error addresses which has a cardinality of K (matching the payload data size in M-bit words) and provides a one-to-one mapping between values of the address field and locations of a single bit error within the payload data. This permits rapid and efficient identification of the location of the M-bit word containing the bit error. A bit error rowportion 50 of the matrix generates a bit error indicating field that indicates if a bit error is present in the M-bit word of the payload data and provides information as to where the bit error is located within this M-bit word. In one embodiment, this bit error indicating field may be a simple parity bit within the check data. A parity bit would be generated from the matrix of FIG. 4 if the bit error row had values all of "1". Auxiliary field generating rows of the matrix of FIG. 4 serves to generate an auxiliary field within the check data occupying the remaining bits of the checked data which are not consumed by the A bits of the address field or the E bits of the bit error indicating field. Accordingly, the auxiliary field has a size of P−(A+E). The auxiliary rows 52 of the matrix of FIG. 4 serves to provide in conjunction with the address field and the bit error indicating field a checksum for a systematic code relating to the payload data that provides a minimum Hamming distance of T, where T is given by one of T=3 to provide single error correction capability and T=4 to provide single error correction and double error detection capability of the error correction mechanism.

Figure 5:
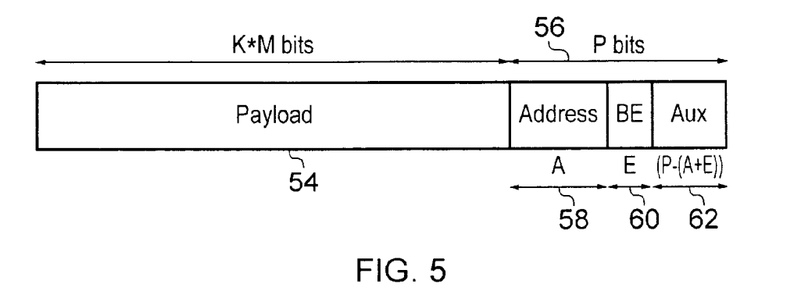
FIG. 5 schematically illustrates a block of payload data with its check data.

FIG. 5 schematically illustrates the calculated data 48 produced by the matrix multiplication of FIG. 3. In particular, this corresponds to (K*M) bits of payload data 54 and P bits of check data 56. The P bits of check data 56 comprises A bits of address field 58, E bits of bit error indicating field 60 and P−(A+E) bits of auxiliary field 62. The address field 58 has a cardinality of K and accordingly provides a one-to-one mapping between values of the address field and locations of a single bit error within the payload data 54. The bit error indicating field 60 indicates if a bit error is present. The bit error indicating field may be a simple parity bit. The auxiliary field 62 serves to increase the vector size of the check data such that together with the address field and the bit error indicating field, the check data 56 provides a checksum for a systematic code relating to the payload data 54 giving a minimum Hamming distance providing the desired one of single error correction capability or single error correction and double error detection capability. The auxiliary field 62 may need to be longer in the case of providing the double error detection capability.

In particular, for M<4 where single error correction capability is required then it may be sufficient for P=n+m+2, where n is the rounded up value of the logarithm to the base two of the payload data size. If the repair circuitry is to provide single error repair and double error detection capability, then the check data size P should be increased to p=n+m+3. If the payload data size is decreased below a value corresponding to an integer power of two, then the corresponding check data size required to provide the desired degree of correction capability will decrease at first by one bit, but will not decrease further until the payload data size is reduced by more than half.

Figure 6:
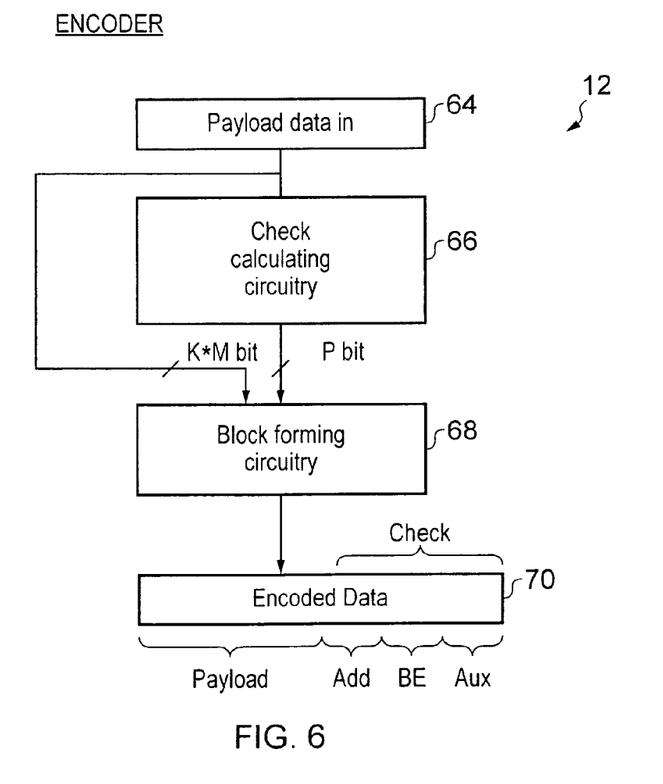
FIG. 6 schematically illustrates encoder circuitry for forming check data from a block of payload data.

FIG. 6 schematically illustrates encoder circuitry 12. A payload data in register 64 receives a block of payload data to be subject to check data calculation. Check calculating circuitry 66 performs the matrix multiplication upon the payload data as illustrated in conjunction with FIGS. 3, 4 and 5. This generates P bits of payload data. The P bits of payload data is combined with the (K*M) bits of payload data by block forming circuitry 68. The encoded data comprising data having the form illustrated in FIG. 5 is captured in encoded data output register 70. This data is then, for example, stored within a memory or transmitted over a transmission link. The processing performed on encoding and decoding in accordance with the present techniques can be represented in the pseudo-code given below. This pseudo-code listing performs check data generation with the check data being formed having the characteristics previously discussed. In particular, the check data includes an address field encoding a set of error addresses which has a cardinality of K providing a one-to-one mapping between values of the address field and a location of a M-bit word within the payload data containing a single bit error. The processing also provides a bit error indicating field indicating if a bit error is present and an auxiliary field having a minimum size serving as a bit vector such that together with the address field and the bit error indicating field it provides a check sum for giving a systematic code with a minimum Hamming distance required for either single error correction capability or single error correction and double error detection capability as desired. Transforming pseudo-code into synthesizable hardware for performing the specified processing is a technique familiar to those in this field.

Figure 7:
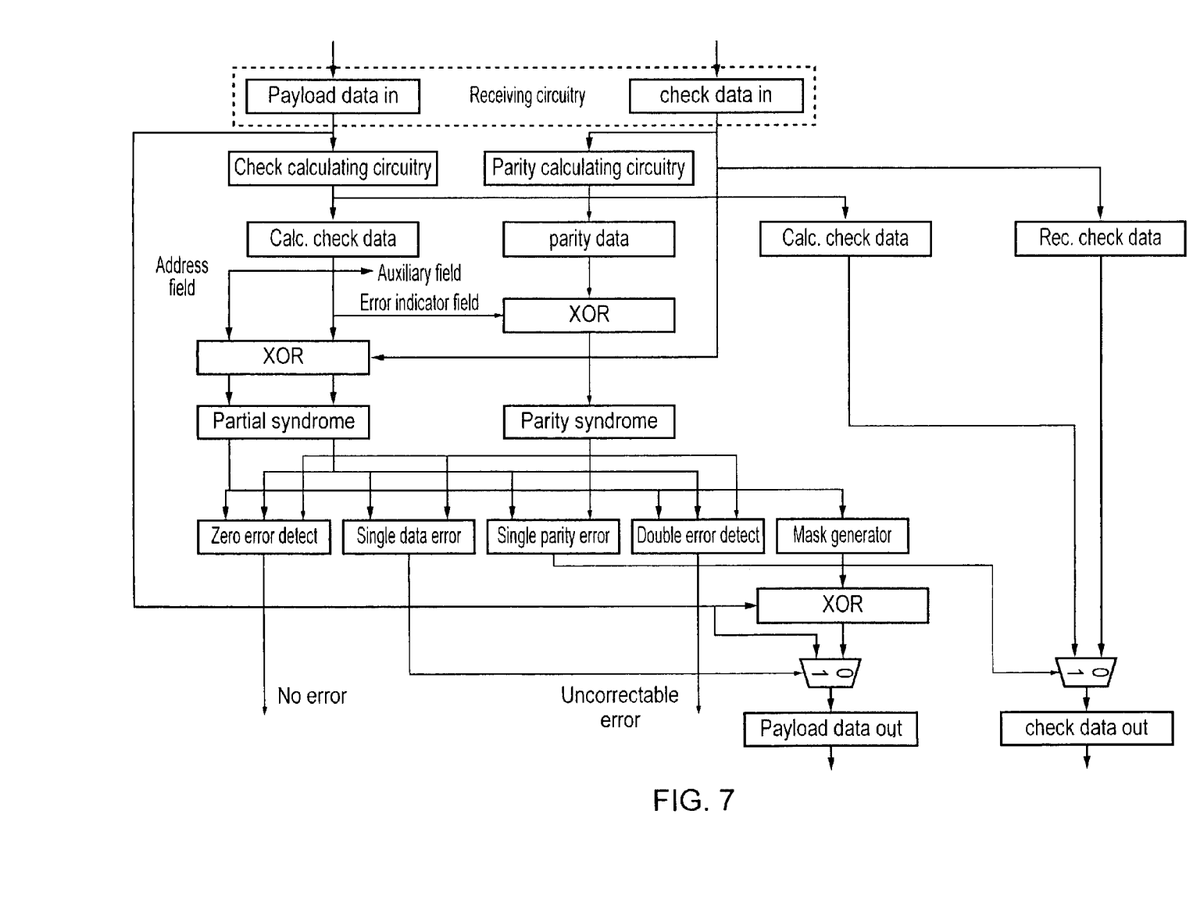
FIG. 7 schematically illustrates decoder circuitry for performing single error correction and double error detection in a manner similar to FIG. 2 but modified for faster operation.

FIG. 7 illustrates a decoder similar to that of FIG. 2 but modified for faster and more efficient operation and implementation.

| ENCODER M = 1 |
| --- |
| #ifndef __HAMM2__E__NANDFEC__H__INCLUDED__<br>#define __HAMM2__E__NANDFEC__H__INCLUDED__<br>extern const unsigned short K__nandfec;<br>extern const unsigned short K__word__nandfec;<br>extern const unsigned short N__bpw__nandfec;<br>extern const unsigned short N__nandfec;<br>extern const unsigned short N__word__nandfec;<br>#ifdef __STDC__<br>extern void hamm2__e__nandfec (<br>    const unsigned char    *X,<br>    unsigned char    *Y);<br>#else<br>extern hamm2__e__nandfec (X,Y);<br>#endif<br>#endif /* __HAMM2__E__NANDFEC__H__INCLUDED__ */ |

| ENCODER M = 1 |
| --- |
| #include <math.h><br>#include <malloc.h><br>const unsigned short K__nandfec = 4096;<br>const unsigned short K__word__nandfec = 512;<br>const unsigned short N__bpw__nandfec = 8;<br>const unsigned short N__nandfec = 4111;<br>const unsigned short N__word__nandfec = 514;<br>static const unsigned char xorcnt[256] = {<br>    0,1,1,0,1,0,0,1,1,0,0,1,0,1,1,0,<br>    1,0,0,1,0,1,1,0,0,1,1,0,1,0,0,1,<br>    1,0,0,1,0,1,1,0,0,1,1,0,1,0,0,1,<br>    0,1,1,0,1,0,0,1,1,0,0,1,0,1,1,0,<br>    1,0,0,1,0,1,1,0,0,1,1,0,1,0,0,1,<br>    0,1,1,0,1,0,0,1,1,0,0,1,0,1,1,0,<br>    0,1,1,0,1,0,0,1,1,0,0,1,0,1,1,0,<br>    1,0,0,1,0,1,1,0,0,1,1,0,1,0,0,1,<br>    1,0,0,1,0,1,1,0,0,1,1,0,1,0,0,1,<br>    0,1,1,0,1,0,0,1,1,0,0,1,0,1,1,0,<br>    0,1,1,0,1,0,0,1,1,0,0,1,0,1,1,0,<br>    1,0,0,1,0,1,1,0,0,1,1,0,1,0,0,1,<br>    0,1,1,0,1,0,0,1,1,0,0,1,0,1,1,0,<br>    1,0,0,1,0,1,1,0,0,1,1,0,1,0,0,1,<br>    1,0,0,1,0,1,1,0,0,1,1,0,1,0,0,1,<br>    0,1,1,0,1,0,0,1,1,0,0,1,0,1,1,0};<br>static const unsigned char rmtab[256] = {<br>    0x00,0x01,0x03,0x02,0x05,0x04,0x06,0x07,0x07,0x06,0x04,0x05,0x02,0x03,0x01,0x00,<br>    0x09,0x08,0x0a,0x0b,0x0c,0x0d,0x0f,0x0e,0x0e,0x0f,0x0d,0x0c,0x0b,0x0a,0x08,0x09,<br>    0x0b,0x0a,0x08,0x09,0x0e,0x0f,0x0d,0x0c,0x0c,0x0d,0x0f,0x0e,0x09,0x08,0x0a,0x0b,<br>    0x02,0x03,0x01,0x00,0x07,0x06,0x04,0x05,0x05,0x04,0x06,0x07,0x00,0x01,0x03,0x02,<br>    0x0d,0x0c,0x0e,0x0f,0x08,0x09,0x0b,0x0a,0x0a,0x0b,0x09,0x08,0x0f,0x0e,0x0c,0x0d,<br>    0x04,0x05,0x07,0x06,0x01,0x00,0x02,0x03,0x03,0x02,0x00,0x01,0x06,0x07,0x05,0x04, |

ENCODER M = 1

```
0x06,0x07,0x05,0x04,0x03,0x02,0x00,0x01,0x01,0x00,0x02,0x03,0x04,0x05,0x07,0x06,
0x0f,0x0e,0x0c,0x0d,0x0a,0x0b,0x09,0x08,0x08,0x09,0x0b,0x0a,0x0d,0x0c,0x0e,0x0f,
0x0f,0x0e,0x0c,0x0d,0x0a,0x0b,0x09,0x08,0x08,0x09,0x0b,0x0a,0x0d,0x0c,0x0e,0x0f,
0x06,0x07,0x05,0x04,0x03,0x02,0x00,0x01,0x01,0x00,0x02,0x03,0x04,0x05,0x07,0x06,
0x04,0x05,0x07,0x06,0x01,0x00,0x02,0x03,0x03,0x02,0x00,0x01,0x06,0x07,0x05,0x04,
0x0d,0x0c,0x0e,0x0f,0x08,0x09,0x0b,0x0a,0x0a,0x0b,0x09,0x08,0x0f,0x0e,0x0c,0x0d,
0x02,0x03,0x01,0x00,0x07,0x06,0x04,0x05,0x05,0x04,0x06,0x07,0x00,0x01,0x03,0x02,
0x0b,0x0a,0x08,0x09,0x0e,0x0f,0x0d,0x0c,0x0c,0x0d,0x0f,0x0e,0x09,0x08,0x0a,0x0b,
0x09,0x08,0x0a,0x0b,0x0c,0x0d,0x0f,0x0e,0x0e,0x0f,0x0d,0x0c,0x0b,0x0a,0x08,0x09,
0x00,0x01,0x03,0x02,0x05,0x04,0x06,0x07,0x07,0x06,0x04,0x05,0x02,0x03,0x01,0x00};
#include "hamm2_e_nandfec.h"
#ifdef _STDC_
void hamm2_e_nandfec (
    const unsigned char    *X,
    unsigned char          *Y)
#else
hamm2_e_nandfec (X,Y)
const unsigned char    *X;
unsigned char          *Y;
#endif
{
int        i;
unsigned char AC=0;
unsigned short CD=0;
unsigned short check;
for (i=0;i<K_word_nandfec;i++)
    {
    unsigned char Xi=X[i];
    unsigned char Ci=rmtab[Xi];
    unsigned short Xxor = (K_word_nandfec-(Ci&0x01))&0x01ff;
    CD ^= Xxor&i;
    AC ^= Ci;
    Y[i] = Xi;
    }
CD = (CD<<3) | (AC>>1);
check = (4-(AC&0x01))&0x03;
check |= (xorcnt[CD>>4] ^ xorcnt[(CD&0x0f)<<4] ^ (AC&0x01))<<2;
Y[512] = (CD&0x0ff0)>>4;
Y[513] = ((CD&0x000f)<<3) | check;
return;
}
```

DECODER M = 1

```
#ifndef _HAMM2_D_NANDFEC_H_INCLUDED_
#define _HAMM2_D_NANDFEC_H_INCLUDED_
typedef enum {
    hamm2_d_nandfec_no_error = 0,
    hamm2_d_nandfec_single_d_error,
    hamm2_d_nandfec_single_p_error,
    hamm2_d_nandfec_multiple_error,
    N_hamm2_d_nandfec_error
} hamm2_d_nandfec_error_t;
#ifdef _STDC_
extern hamm2_d_nandfec_error_t hamm2_d_nandfec (
    const unsigned char    *X,
    unsigned char          *Y);
#else
extern hamm2_d_nandfec_error_t hamm2_d_nandfec (X,Y);
#endif
#endif /* _HAMM2_D_NANDFEC_H_INCLUDED_ */
```

DECODER M = 1

```
#include <math.h>
#include <malloc.h>
static const unsigned char cnt[256] = {
    0,1,1,2,1,2,2,3,1,2,2,3,2,3,3,4,
    1,2,2,3,2,3,3,4,2,3,3,4,3,4,4,5,
    1,2,2,3,2,3,3,4,2,3,3,4,3,4,4,5,
    2,3,3,4,3,4,4,5,3,4,4,5,4,5,5,6,
    1,2,2,3,2,3,3,4,2,3,3,4,3,4,4,5,
    2,3,3,4,3,4,4,5,3,4,4,5,4,5,5,6,
    2,3,3,4,3,4,4,5,3,4,4,5,4,5,5,6,
    3,4,4,5,4,5,5,6,4,5,5,6,5,6,6,7,
    1,2,2,3,2,3,3,4,2,3,3,4,3,4,4,5,
    2,3,3,4,3,4,4,5,3,4,4,5,4,5,5,6,
    2,3,3,4,3,4,4,5,3,4,4,5,4,5,5,6,
    3,4,4,5,4,5,5,6,4,5,5,6,5,6,6,7,
    2,3,3,4,3,4,4,5,3,4,4,5,4,5,5,6,
    3,4,4,5,4,5,5,6,4,5,5,6,5,6,6,7,
    3,4,4,5,4,5,5,6,4,5,5,6,5,6,6,7,
    4,5,5,6,5,6,6,7,5,6,6,7,6,7,7,8};
#include "hamm2_e_nandfec.h"
#include "hamm2_d_nandfec.h"
#ifdef _STDC_
hamm2_d_nandfec_error_t hamm2_d_nandfec (
    const unsigned char    *X,
    unsigned char          *Y)
#else
hamm2_d_nandfec_error_t hamm_d_nandfec (X,Y)
const unsigned char    *X;
unsigned char          *Y;
#endif
{
unsigned int   error=hamm2_d_nandfec_no_error;
unsigned char Z[2];
hamm2_e_nandfec(X,Y);
```

DECODER M = 1

```
Z[0] = Y[512] ^ X[512];
Z[1] = Y[513] ^ X[513];
if((Z[0] | Z[1]) != 0)
    {
    unsigned short weight = cnt[Z[0]] + cnt[Z[1]];
    unsigned short parity = weight&0x01;
    unsigned short check = Z[1]&0x03;
    if (weight == 1)
        {
/*
 * The error was in the received parity {X[512],X[513]}, thus the
 * recomputed checksum {Y[512],Y[513]} is correct
 */
        error = hamm2_d_nandfec_single_p_error;
        }
    else if ((check==0x03) && (parity==1))
        {
        unsigned short address = (Z[0]<<4) | ((Z[1]&0x78)>>3);
        unsigned short bit_address = address&0x07;
        unsigned short byte_address = address>>3;
        Y[byte_address]=Y[byte_address]^(0x01<<bit_address);
/*
 * The error was in the received data {X[0],X[1],...,X[511]}, thus the
 * original checksum {X[512],X[513]} is correct
 */
        Y[512] = X[512];
        Y[513] = X[513];
        error = hamm2_d_nandfec_single_d_error;
        }
```

DECODER M = 1

```
    else
        error = hamm2_d_nandfec_multiple_error;
    }
return error;
}
```

ENCODER M = 8

```
#ifndef _HAMM2_E_NANDFEC_H_INCLUDED_
#define _HAMM2_E_NANDFEC_H_INCLUDED_
extern const unsigned short K_nandfec;
extern const unsigned short K_word_nandfec;
extern const unsigned short N_bpw_nandfec;
extern const unsigned short N_nandfec;
extern const unsigned short N_word_nandfec;
#ifdef _STDC_
extern void hamm2_e_nandfec (
    const unsigned char    *X,
    unsigned char          *Y);
#else
extern hamm2_e_nandfec (X,Y);
#endif
#endif /* _HAMM2_E_NANDFEC_H_INCLUDED_ */
```

ENCODER M = 8

```
#include <math.h>
#include <malloc.h>
const unsigned short K_nandfec = 4096;
const unsigned short K_word_nandfec = 512;
const unsigned short N_bpw_nandfec = 8;
const unsigned short N_nandfec = 4110;
const unsigned short N_word_nandfec = 514;
static const unsigned char xorcnt[256] = {
    0,1,1,0,1,0,0,1,1,0,0,1,0,1,1,0,
    1,0,0,1,0,1,1,0,0,1,1,0,1,0,0,1,
    1,0,0,1,0,1,1,0,0,1,1,0,1,0,0,1,
    0,1,1,0,1,0,0,1,1,0,0,1,0,1,1,0,
    1,0,0,1,0,1,1,0,0,1,1,0,1,0,0,1,
    0,1,1,0,1,0,0,1,1,0,0,1,0,1,1,0,
    0,1,1,0,1,0,0,1,1,0,0,1,0,1,1,0,
    1,0,0,1,0,1,1,0,0,1,1,0,1,0,0,1,
    1,0,0,1,0,1,1,0,0,1,1,0,1,0,0,1,
    0,1,1,0,1,0,0,1,1,0,0,1,0,1,1,0,
    0,1,1,0,1,0,0,1,1,0,0,1,0,1,1,0,
    1,0,0,1,0,1,1,0,0,1,1,0,1,0,0,1,
    0,1,1,0,1,0,0,1,1,0,0,1,0,1,1,0,
    1,0,0,1,0,1,1,0,0,1,1,0,1,0,0,1,
    1,0,0,1,0,1,1,0,0,1,1,0,1,0,0,1,
    0,1,1,0,1,0,0,1,1,0,0,1,0,1,1,0};
static const unsigned char etab[256] = {
0x00,0x0f,0x17,0x18,0x27,0x28,0x30,0x3f,0x1b,0x14,0x0c,0x03,0x3c,0x33,0x2b,0x24,
0x2b,0x24,0x3c,0x33,0x0c,0x03,0x1b,0x14,0x30,0x3f,0x27,0x28,0x17,0x18,0x00,0x0f,
0x1d,0x12,0x0a,0x05,0x3a,0x35,0x2d,0x22,0x06,0x09,0x11,0x1e,0x21,0x2e,0x36,0x39,
0x36,0x39,0x21,0x2e,0x11,0x1e,0x06,0x09,0x2d,0x22,0x3a,0x35,0x0a,0x05,0x1d,0x12,
0x35,0x3a,0x22,0x2d,0x12,0x1d,0x05,0x0a,0x2e,0x21,0x39,0x36,0x09,0x06,0x1e,0x11,
0x1e,0x11,0x09,0x06,0x39,0x36,0x2e,0x21,0x05,0x0a,0x12,0x1d,0x22,0x2d,0x35,0x3a,
0x28,0x27,0x3f,0x30,0x0f,0x00,0x18,0x17,0x33,0x3c,0x24,0x2b,0x14,0x1b,0x03,0x0c,
0x03,0x0c,0x14,0x1b,0x24,0x2b,0x33,0x3c,0x18,0x17,0x0f,0x00,0x3f,0x30,0x28,0x27,
0x39,0x36,0x2e,0x21,0x1e,0x11,0x09,0x06,0x22,0x2d,0x35,0x3a,0x05,0x0a,0x12,0x1d,
0x12,0x1d,0x05,0x0a,0x35,0x3a,0x22,0x2d,0x09,0x06,0x1e,0x11,0x2e,0x21,0x39,0x36,
0x24,0x2b,0x33,0x3c,0x03,0x0c,0x14,0x1b,0x3f,0x30,0x28,0x27,0x18,0x17,0x0f,0x00,
0x0f,0x00,0x18,0x17,0x28,0x27,0x3f,0x30,0x14,0x1b,0x03,0x0c,0x33,0x30,0x24,0x2b,
0x0c,0x03,0x1b,0x14,0x2b,0x24,0x3c,0x33,0x17,0x18,0x00,0x0f,0x30,0x3f,0x27,0x28,
0x27,0x28,0x30,0x3f,0x00,0x0f,0x17,0x18,0x3c,0x33,0x2b,0x24,0x1b,0x14,0x0c,0x03,
0x11,0x1e,0x06,0x09,0x36,0x39,0x21,0x2e,0x0a,0x05,0x1d,0x12,0x2d,0x22,0x3a,0x35,
0x3a,0x35,0x2d,0x22,0x1d,0x12,0x0a,0x05,0x21,0x2e,0x36,0x39,0x06,0x09,0x11,0x1e};
#include "hamm2_e_nandfec.h"
```

ENCODER M = 8

```c
#ifdef __STDC__
void hamm2_e_nandfec (
    const unsigned char    *X,
    unsigned char          *Y)
#else
hamm2_e_nandfec (X,Y)
const unsigned char    *X;
unsigned char          *Y;
#endif
{
int        i;
unsigned char AC=0;
unsigned short CD=0;
unsigned short P=0;
for (i=0;i<K_word_nandfec;i++)
    {
    unsigned char Xi=X[i];
    unsigned char Ci=etab[Xi];
    unsigned short Xxor = (K_word_nandfec-(Ci&0x01))&0x01ff;
    CD ^= Xxor&i;
    AC ^= Ci;
    Y[i] = Xi;
    }
P = ((CD&0x0100)>>8) ^ (xorcnt[CD&0xff]);
CD = ((CD<<5) | (AC>>1)) ^ P;
Y[512] = (CD&0x3fc0)>>6;
Y[513] = CD&0x003f;
return;
}
```

DECODER M = 8

```c
#ifndef _HAMM2_D_NANDFEC_H_INCLUDED_
#define _HAMM2_D_NANDFEC_H_INCLUDED_
typedef enum {
    hamm2_d_nandfec_no_error = 0,
    hamm2_d_nandfec_single_d_error,
    hamm2_d_nandfec_single_p_error,
    hamm2_d_nandfec_double_error,
    hamm2_d_nandfec_tripple_error,
    N_hamm2_d_nandfec_error
} hamm2_d_nandfec_error_t;
#ifdef __STDC__
extern hamm2_d_nandfec_error_t hamm2_d_nandfec (
    const unsigned char    *X,
    unsigned char          *Y);
#else
extern hamm2_d_nandfec_error_t hamm2_d_nandfec (X,Y);
#endif
#endif /* _HAMM2_D_NANDFEC_H_INCLUDED_ */
```

DECODER M = 8

```c
#include <math.h>
#include <malloc.h>
static const unsigned char cnt[256] = {
    0,1,1,2,1,2,2,3,1,2,2,3,2,3,3,4,
    1,2,2,3,2,3,3,4,2,3,3,4,3,4,4,5,
    1,2,2,3,2,3,3,4,2,3,3,4,3,4,4,5,
    2,3,3,4,3,4,4,5,3,4,4,5,4,5,5,6,
    1,2,2,3,2,3,3,4,2,3,3,4,3,4,4,5,
    2,3,3,4,3,4,4,5,3,4,4,5,4,5,5,6,
    2,3,3,4,3,4,4,5,3,4,4,5,4,5,5,6,
    3,4,4,5,4,5,5,6,4,5,5,6,5,6,6,7,
    1,2,2,3,2,3,3,4,2,3,3,4,3,4,4,5,
    2,3,3,4,3,4,4,5,3,4,4,5,4,5,5,6,
    2,3,3,4,3,4,4,5,3,4,4,5,4,5,5,6,
    3,4,4,5,4,5,5,6,4,5,5,6,5,6,6,7,
    2,3,3,4,3,4,4,5,3,4,4,5,4,5,5,6,
    3,4,4,5,4,5,5,6,4,5,5,6,5,6,6,7,
    3,4,4,5,4,5,5,6,4,5,5,6,5,6,6,7,
    4,5,5,6,5,6,6,7,5,6,6,7,6,7,7,8};
static const unsigned char S[32] = {
    128,8,9,130,10,130,130,0,
    11,130,130,1,130,3,5,130,
    12,130,130,2,130,4,131,130,
    130,131,6,130,7,130,130,131};
#include "hamm2_e_nandfec.h"
#include "hamm2_d_nandfec.h"
#ifdef __STDC__
hamm2_d_nandfec_error_t hamm2_d_nandfec (
    const unsigned char    *X,
    unsigned char          *Y)
#else
hamm2_d_nandfec_error_t hamm2_d_nandfec (X,Y)
const unsigned char    *X;
unsigned char          *Y;
#endif
{
unsigned int error=hamm2_d_nandfec_no_error;
unsigned char Z[2];
hamm2_e_nandfec(X,Y);
Z[0] = Y[512] ^ X[512];
Z[1] = Y[513] ^ X[513];
{
unsigned short byte_address = (((unsigned short)Z[0])<<1) |
    ((Z[1]&0x20)>>5);
unsigned char cnt_address =
    cnt[byte_address&0xff]+((byte_address&0x0100)>>8);
unsigned char parity = cnt_address&0x01;
unsigned char byte_syndrome = (Z[1]&0x1f)^parity;
unsigned char syncode = S[byte_syndrome];
```

-continued

DECODER M = 8

```
if (syncode<8)
   {
      unsigned char bit_address = syncode;
      Y[byte_address] ^= (0x01<<bit_address);
/*
 * The error was in the received data {X[0],X[1],...,X[511]}, thus the
 * original checksum {X[512],X[513]} is correct
 */
      Y[512] = X[512];
      Y[513] = X[513];
      error = hamm2_d_nandfec_single_d_error;
   }
else if ((((syncode>8)&&(syncode<13)) && (byte_address==0)) ||
         ((syncode==8) && (cnt_address<=1)))
   {
      error = hamm2_d_nandfec_single_p_error;
   }
else if (((syncode==128) && (cnt_address>0)) ||
         (syncode==130))
   {
      error = hamm2_d_nandfec_double_error;
   }
else if ((((syncode>8) && (syncode<13)) && (byte_address!=0)) ||
         ((syncode==8) && (cnt_address>1)) ||
         (syncode==131))
   {
      error = hamm2_d_nandfec_triple_error;
   }
}
return error;
}
```

For K data bits and N coded bits, SECDED codes are characterised by the parameters (N,K,4), with N−K checksum bits. This code can be represented by a binary generator (encoding) and check (decoding) matrices, G respectively H. G is of size N×K, and is of size (N−K)×N, with:

$$H \cdot G = 0 \quad (1)$$

And for systematic codes:

$$[G_p \quad I^{(N-K)}] \cdot \begin{bmatrix} I^K \\ G_P \end{bmatrix} \quad (2)$$

With $G_p$ the checksum section of the generator matrix G and $I^m$ the identity matrix of size m×m.

The checksum bits for this code are defined through $G_p$ as follows:

$$G_p = \begin{bmatrix} 0 & 1 & 0 & 1 & 0 & 1 & 0 & 1 & 0 & 1 & 0 & \ldots & 0 & 1 & 0 & 1 & \ldots & 1 & 0 & 1 & 0 & 1 \\ 0 & 0 & 1 & 1 & 0 & 0 & 1 & 1 & 0 & 0 & 1 & 1 & 0 & & 1 & 1 & 0 & 0 & & 1 & 0 & 0 & 1 & 1 \\ 0 & 0 & 0 & 0 & 1 & 1 & 1 & 1 & 0 & 0 & 0 & 0 & 1 & \ldots & 1 & 1 & 0 & 0 & \ldots & 0 & 1 & 1 & 1 & 1 \\ \vdots & & & & & & & & & & & & & & \vdots & & \vdots & & & \vdots & & & & \vdots \\ 0 & 0 & 0 & 0 & 0 & 0 & 0 & 0 & 0 & 0 & 0 & 0 & & & 0 & 0 & 1 & 1 & & 1 & 1 & 1 & 1 & 1 \\ 1 & 1 & 1 & 1 & 1 & 1 & 1 & 1 & 1 & 1 & 1 & \ldots & 1 & 1 & 1 & 1 & \ldots & 1 & 1 & 1 & 1 & 1 \\ 1 & 1 & 1 & 1 & 1 & 1 & 1 & 1 & 1 & 1 & 1 & & 1 & 1 & 1 & 1 & & 1 & 1 & 1 & 1 & 1 \\ 1 & 0 & 0 & 1 & 0 & 1 & 1 & 0 & 0 & 1 & 1 & 0 & 1 & \ldots & 1 & 0 & 0 & 1 & \ldots & 0 & 1 & 0 & 0 & 1 \end{bmatrix} \quad (3)$$

For $K=2^n$, the first n+1 rows are equal to the first order Reed Muller parity check matrix $RM_1$, the first n rows thus form the error address. The (all-one) parity check row is repeated and the final row is an odd parity check on the first n+1 row part of the columns. Or:

$$c_{n+3} = [c_{n+1}{}^0 c_{n+1}{}^1 c_{n+1}{}^2 c_{n+1}{}^3 \ldots c_{n+1}{}^n c_{n+1}{}^n c_p] \quad (4)$$

Where $c_p$ is an odd parity check bit on $c_{n+3}$.

$$c_p = \begin{cases} 0 \mid \text{weigth}(c_{n+1}) = 0 \\ 1 \mid \text{weigth}(c_{n+1}) = 1 \end{cases} \quad (5)$$

Because the logic function of the parity bit $c_p$ is only to detect errors in the checksum itself, thus to guard the correct identification of the single error correction and the double error detection case, decoding can be simplified.

Let $c_{n+3}(r)$ be the received checksum and let $c''_{n+1}(c)$ be the re-computed data parity bit computed according to equation (3), row n. The syndrome $c_{n+3}$ is then given by $$c_{n+3} = [c_{n+3}{}^0 c_{n+3}{}^1 c_{n+3}{}^2 c_{n+3}{}^3 \ldots c_{n+3}{}^n c_{n+3}{}^{n+1} c_p] \quad (6)$$

Where $c_p$ is the syndrome parity check bit and is defined as $$c_p = c''_{n+1}(c) + c_p(r), \quad (7)$$

$$c_p(r) = \begin{cases} 0 \mid \text{weigth}(c_{n+3}(r)) = 0 \\ 1 \mid \text{weigth}(c_{n+3}(r)) = 1 \end{cases}$$

Both the bits $c''_{n+1}(c)$ and $c_p(r)$ can be computed directly from the data. With equation (6), the remaining bits of the syndrome are computed in the traditional way.

Equation (3) defines a bit-error-address SECDED code where the first n rows will form the bit-address, the subsequent two rows form a bit-error indicator field and the last row forms an auxiliary field used to test the validity of the checksum. The total checksum length for $K=2^n$, is thus n+3, which is one more than for extended Hamming SECDED codes.

Below the construction of the matrix $G_p$ is given which has the same properties and structure as described above, but with the following differences. The first rows will form a word address, the subsequent row is the auxiliary field and the last rows form the bit-error indicator field which determines the bit-error position in the erroneous word indicated by the word address field. For $K=2^n$ words and $M=2^m$ and $M \geq 4$ this requires n+m+2 check bits, thus the same number as extended Hamming SECDED codes. With T=K×M.

The repetition matrix $P_1$ has size K×T and formed by M interleaved K×K identity matrices. The matrix $P_2$ has size M×T and is formed by concatenating K identity matrices of size M×M.

$$P_1 = \begin{bmatrix} 1 & 1 & 1 & 1 & 1 & \ldots & 1 & 0 & 0 & 0 & 0 & 0 & 0 & 0 & 0 & 0 & & & & & & & \\ 0 & 0 & 0 & 0 & 0 & & 0 & 1 & 1 & 1 & 1 & 1 & \ldots & 1 & 0 & 0 & & & \varnothing & & & \\ & & & & & & & & & & & & & 1 & 1 & \ldots & & & & & & \\ & & & & & & & & & & & & & & & \ddots & & & & & & \\ & & & & \varnothing & & & & & & & & & & & & \ldots & 1 & 0 & 0 & 0 & 0 & 0 & 0 \\ & & & & & & & & & & & & & & & & & 0 & 1 & 1 & 1 & 1 & 1 & \ldots & 1 \end{bmatrix} \quad (8)$$

$$P_2 = \begin{bmatrix} 1 & & & & 1 & & & & 1 & & & & 1 & & & \\ & 1 & & \varnothing & & 1 & & \varnothing & & 1 & & \varnothing & & 1 & & \varnothing \\ & & 1 & & & & 1 & & & & 1 & & & & 1 & \\ & \varnothing & & \ddots & & \varnothing & & \ddots & & \varnothing & & \ddots \ddots & & \varnothing & & \ddots \\ & & 1 & & & & 1 & & & & 1 & & & & 1 & \end{bmatrix}$$

The address core matrix $M_1$ has size $(n+m+2) \times K$. The first n rows are as the first n rows of $G_p$ in equation (3). And thus contain the K addresses. The next row contains the auxiliary bit $c_p$ as above, but with the opposite rule as in equation (5) as to yield even parity over the columns of $M_1$. The last m+1 rows are zer0.

$$M_1 = \begin{bmatrix} 0 & 1 & 0 & 1 & 0 & 1 & 0 & 1 & 0 & 1 & 0 & \ldots & 0 & 1 & 0 & 1 & \ldots & 1 & 0 & 1 & 0 & 1 \\ 0 & 0 & 1 & 1 & 0 & 0 & 1 & 1 & 0 & 0 & 1 & 1 & 0 & & 1 & 1 & 0 & 0 & & 1 & 0 & 0 & 1 & 1 \\ 0 & 0 & 0 & 0 & 1 & 1 & 1 & 1 & 0 & 0 & 0 & 0 & 1 & \ldots & 1 & 1 & 0 & 0 & \ldots & 0 & 1 & 1 & 1 & 1 \\ \vdots & & & & & & & & & & & & & & \vdots & & \vdots & & \vdots & & & \vdots \\ 0 & 0 & 0 & 0 & 0 & 0 & 0 & 0 & 0 & 0 & 0 & 0 & 0 & \ldots & 0 & 0 & 1 & 1 & \ldots & 1 & 1 & 1 & 1 & 1 \\ 0 & 1 & 1 & 0 & 1 & 0 & 0 & 1 & 1 & 0 & 0 & 1 & 0 & & 1 & 0 & 1 & 0 & & 0 & 1 & 0 & 0 & 1 \\ 0 & 0 & 0 & 0 & 0 & 0 & 0 & 0 & 0 & 0 & 0 & 0 & 0 & \ldots & 0 & 0 & 0 & 0 & \ldots & 0 & 0 & 0 & 0 & 0 \\ \vdots & & & & & & & & & & & & & & \vdots & & \vdots & & \vdots & & & \vdots \\ 0 & 0 & 0 & 0 & 0 & 0 & 0 & 0 & 0 & 0 & 0 & 0 & 0 & \ldots & 0 & 0 & 0 & 0 & \ldots & 0 & 0 & 0 & 0 & 0 \end{bmatrix} \quad (9)$$

The error indicator core matrix $M_2$ has size $(n+m+2) \times M$. Its first n rows are zero, the next m+2 rows contains the joint auxiliary field and error indicator field. Note that the auxiliary field rows of $M_1$ and $M_2$ overlap. Which causes the reduction in checksum length as compared to the bit-error-address code above.

The choice for the $(m+2) \times M$ sub matrix formed by the last m+2 rows of $M_2$ can be the generator matrix of an $(M+m+2, M, 4)$ extended Hamming code.

$$M_2 = \begin{bmatrix} 0 & 0 & 0 & 0 & 0 & 0 & 0 & 0 \\ \vdots & & & & & & & \vdots \\ 0 & 0 & 0 & 0 & 0 & 0 & 0 & 0 \\ 1 & 1 & 1 & 1 & 1 & 0 & 0 & 0 \\ 1 & 1 & 1 & 0 & 0 & 1 & 1 & 0 \\ 1 & 0 & 0 & 1 & 1 & 1 & 0 & 1 \\ 0 & 1 & 0 & 1 & 0 & 1 & 1 & 1 \\ 0 & 0 & 1 & 0 & 1 & 0 & 1 & 1 \end{bmatrix} \quad (10)$$

The matrix $G_p$ can be formed from $M_1, M_2, P_1,$ and $P_2$, by:

$$G_p = \begin{bmatrix} M_1 & M_2 \end{bmatrix} \cdot \begin{bmatrix} P_1 \\ P_2 \end{bmatrix} = M_1 \cdot P_1 + M_2 \cdot P_2 \quad (40)$$

The first n rows of $G_p$ contain the word address.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Apparatus for decoding data comprising:
   receiving circuitry configured to receive a block of data formed of K M-bit words of payload data and P bits of received check data;
   check calculating circuitry configured to calculate P bits of calculated check data in dependence upon said K M-bit words of payload data;
   syndrome generating circuitry responsive to said received check data and said calculated check data to generated a syndrome value; and
   repair circuitry responsive to said syndrome value to detect a bit error in said K M-bit words of payload data and to repair said bit error in said K M-bit words of payload data; wherein
   said P bits of check data and said syndrome value have an address field of A bits, a bit error indicating field of E bits and an auxiliary field of (P−(A+E)) bits;

said bit error indicating field indicates if said bit error is present and a position of said bit error within an M-bit word;

said address field encodes a set of error addresses which has a cardinality of K providing a one-to-one mapping between values of said address field and a location of said M-bit word having said bit error within said K M-bit words of said payload data;

said auxiliary field is a bit vector such that together with said address field and said bit error indicating field it provides a checksum for a systematic code with a minimum Hamming distance of T, where T is given by one of T=3 to provide single error correction capability and T=4 to provide single error correction and double error detection capability;

said repair circuitry has error location determining circuitry responsive to said address field to identify an M-bit word containing a bit error within said payload data and responsive to said bit error indicating field to identify the location of said bit error within said M-bit word and bit repair circuitry responsive to said error location determining circuitry to repair said bit error at said location;

said repair circuitry is responsive to said syndrome value to detect a bit error in said P bits of check data and to repair said bit error in said P bits of check data; and said repair circuitry responsive to said address field, said bit error indicating field and said auxiliary field to determine whether said address field and said bit error indicating field are valid.

2. Apparatus as claimed in claim 1, wherein $M=2^m$, $K=2^n$ and $A=n$.

3. Apparatus as claimed in claim 2, wherein M<4 and P=n+m+2 and said repair circuitry provides single error repair capability.

4. Apparatus as claimed in claim 2, wherein M<4 and P=m+n+3 and said repair circuitry provides single error repair and double error detect capability.

5. Apparatus as claimed in claim 2, wherein M>=4 and P=m+n+1 and said repair circuitry provides single error repair capability.

6. Apparatus as claimed in claim 2, wherein M>=4 and P=m+n+2 and said repair circuitry provides single error repair and double error detect capability.

7. Apparatus as claimed in claim 1, wherein $M=2^m$ and $2^n > K > 2^{(n-1)}$ and $A=n$.

8. Apparatus as claimed in claim 7, wherein M<4 and P=m+n+1 and said repair circuitry provides single error repair capability.

9. Apparatus as claimed in claim 7, wherein M<4 and P=m+n+2 said repair circuitry provides single error repair and double error detect capability.

10. Apparatus as claimed in claim 1, wherein said repair circuitry includes double error detection circuitry operating in parallel with said error location determining circuitry and said bit repair circuitry, said double error detection circuitry being responsive to said syndrome value to detect the occurrence of a two bit errors within said payload data.

11. Apparatus as claimed in claim 1, wherein said error location determining circuitry generates an M-bit mask with one non-zero bit from said bit error indicating field and said bit repair circuitry performs an XOR operation upon said M-bit mask and said M-bit word indicated by said address field within said payload data to repair said bit error.

12. Apparatus as claimed in claim 1, wherein said error location determining circuitry generates a K×M-bit mask with one non-zero bit from said bit error indicating field and said said address field, and said bit-repair circuitry performs an XOR operation upon said said K×M-bit mask and said payload data to repair said bit error.

13. Apparatus as claimed in claim 1, wherein M=1.

14. Apparatus as claimed in claim 1, wherein said repair circuitry includes check data detecting circuitry operating in parallel with said error location determining circuitry and said bit repair circuitry, said check data detecting circuitry being responsive to said syndrome value to detect a bit error within said received check data.

15. Apparatus as claimed in claim 1, wherein said address field is a direct linear representation of said location of said bit error within said payload data.

16. Apparatus as claimed in claim 1, wherein said address field is a direct linear representation of said location of said M-bit word having said bit error.

17. Apparatus as claimed in claim 1, wherein said check calculating circuitry is configured at least partially to recursively calculate said calculated check data for said K*M bits of payload data by calculating portion check data for two disjoint (K*M)/2 bit portions of said payload data and combining said portion check data to form said calculated check data.

18. Apparatus for decoding data comprising:

receiving means for receiving a block of data formed of K M-bit words of payload data and P bits of received check data;

check calculating means for calculating P bits of calculated check data in dependence upon said K M-bit words of payload data;

syndrome generating means responsive to said received check data and said calculated check data for generating a syndrome value; and repair means responsive to said syndrome value for detecting a bit error in said K M-bit words of payload data and for repairing said bit error in said K M-bit words of payload data; wherein said P bits of check data and said syndrome value an address field of A bits, a bit error indicating field of E bits and an auxiliary field of (P−(A+E)) bits;

said bit error indicating field indicates if said bit error is present;

said address field encodes a set of error addresses which has a cardinality of K providing a one-to-one mapping between values of said address field and a location of said M-bit word having said bit error within said K M-bit words of said payload data;

said auxiliary field is a bit vector such that together with said address field and said bit error indicating field it provides a checksum for a systematic code with a minimum Hamming distance of T, where T is given by one of T=3 to provide single error correction capability and T=4 to provide single error correction and double error detection capability;

said repair means has error location determining means responsive to said address field for identifying an M-bit word containing a bit error within said payload data and responsive to said bit error indicating field to identify a location of said bit error within said M-bit word and bit repair means responsive to said error location determining circuitry for repairing said bit error at said location;

said repair means is responsive to said syndrome value to detect a bit error in said P bits of check data and to repair said bit error in said P bits of check data; and said repair means is responsive to said address field, said bit error indicating field and said auxiliary field to determine whether said address field and said bit error indicating field are valid.

19. A method of decoding data, said method comprising the steps of:
   receiving a block of data formed of K M-bit words of payload data and P bits of received check data;
   calculating P bits of calculated check data in dependence upon said K M-bit words of payload data;
   in response to said received check data and said calculated check data, generating a syndrome value; and
   in response to said syndrome value, detecting a bit error in said K M-bit words of payload data and repairing said bit error in said K M-bit words of payload data; wherein
   said P bits of check data and said syndrome value have an address field of A bits, a bit error indicating field of E bits and an auxiliary field of (P−(A+E)) bits;
   said bit error indicating field indicates if said bit error is present and a position of said bit error within an M-bit word;
   said address field encodes a set of error addresses which has a cardinality of K providing a one-to-one mapping between values of said address field and a location of said M-bit word having said bit error within said K M-bit words of said payload data;
   said auxiliary field is a bit vector such that together with said address field and said bit error indicating field it provides a checksum for a systematic code with a minimum Hamming distance of T, where T is given by one of T=3 to provide single error correction capability and T=4 to provide single error correction and double error detection capability;
   in response to said address field, identifying an M-bit word containing a bit error within said payload data and in response to said bit error indicating field identifying a location of said bit error within said M-bit word and response to said location repairing said bit error at said location;
   in response to said syndrome value, detecting a bit error in said P bits of check data and repairing said bit error in said P bits of check data; and
   in response to said address field, said bit error indicating field and said auxiliary field, determining whether said address field and said bit error indicating field are valid, said above method steps are implemented on an integrated circuit.

20. Apparatus for encoding data comprising:
   receiving circuitry configured to receive K M-bit words of payload data;
   check calculating circuitry configured to calculate P bits of check data in dependence upon said K M-bit words of payload data; and
   block forming circuitry configured to form a block of data comprising said K M-bit words of payload data and said P bits of check data; wherein
   said P bits of check data and said syndrome value an address field of A bits, a bit error indicating field of E bits and an auxiliary field of (P−(A+E)) bits;
   said bit error indicating field indicates if bit error is present and a position of said bit error within an M-bit word;
   said address field encodes a set of error addresses which has a cardinality of K providing a one-to-one mapping between values of said address field and a location of said M-bit word having said bit error within said K M-bit words of said payload data;
   said auxiliary field is a bit size such that together with said address field and said bit error indicating field it provides a checksum for a systematic code with a minimum Hamming distance of T, where T is given by one of T=3 to provide single error correction capability and T=4 to provide single error correction and double error detection capability.

21. Apparatus as claimed in claim 20, wherein $M=2^m$ and $K=2^n$ and A=n.

22. Apparatus as claimed in claim 21, wherein M<4 and P=m+n+2 and the code formed by concatenating said K bit of payload data with said check data provides single error repair capability.

23. Apparatus as claimed in claim 21, wherein M<4 and P=m+n+3 the code formed by concatenating said K bit of payload data with said check data provides single error repair and double error detection capability.

24. Apparatus as claimed in claim 21, wherein M>=4 and P=m+n+1 and said repair circuitry provides single error repair capability.

25. Apparatus as claimed in claim 21, wherein M>=4 and P=m+n+2 and said repair circuitry provides single error repair and double error detect capability.

26. Apparatus as claimed in claim 20, wherein $M=2^m$, $2^n>K>2^{(n-1)}$ and A=n.

27. Apparatus as claimed in claim 26, wherein M<4 and P=m+n+1 and the code formed by concatenating said K bit of payload data with said check data provides single error repair capability.

28. Apparatus as claimed in claim 26, wherein M<4 and P=m+n+2 the code formed by concatenating said K bit of payload data with said check data provides single error repair and double error detection capability.

29. Apparatus as claimed in claim 20, wherein said address field is a direct linear representation of said location of said bit error within said payload data.

30. Apparatus as claimed in claim 20, wherein said check calculating circuitry is configured to recursively calculate said calculated check data for said (K*M) bits of payload data by calculating portion check data for two disjoint (K*M)/2 bit portions of said payload and combining said portion check data to form said calculated check data.

31. Apparatus as claimed in claim 20, wherein M=1.

32. Apparatus for encoding data comprising:
   receiving means for receiving K M-bit words of payload data;
   check calculating means for calculating P bits of check data in dependence upon said K M-bit words of payload data; and
   block forming means for forming a block of data comprising said K M-bit words of payload data and said P bits of check data; wherein
   said P bits of check data and said syndrome value have an address field of A bits, a bit error indicating field of E bits and an auxiliary field of (P−(A+E)) bits;
   said bit error indicating field indicates if said bit error is present;
   said address field encodes a set of error addresses which has a cardinality of K providing a one-to-one mapping between values of said address field and a location of said M-bit word having said bit error within said K M-bit words of said payload data;
   said auxiliary field has a bit size that together with said address field and said bit error indicating field provides a minimum Hamming distance of T between instances of parity error data corresponding to error free payload data, where T is given by one of T=3 to provide single error correction capability and T=4 to provide single error correction and double error detection capability.

33. A method of encoding data, said method comprising the steps of:
receiving K M-bit words of payload data;
calculating P bits of check data in dependence upon said K M-bit words of payload data; and
forming a block of data comprising said K M-bit words of payload data and said P bits of check data; wherein
said P bits of check data and said syndrome value have an address field of A bits, a bit error indicating field of E bits and an auxiliary field of (P−(A+E)) bits;
said bit error indicating field indicates if said bit error is present and a position of said bit error within an M-bit word;
said address field encodes a set of error addresses which has a cardinality of K providing a one-to-one mapping between values of said address field and a location of said M-bit word having said bit error within said M-bit words of said payload data;
said auxiliary field has a bit size that together with said address field and said bit error indicating field provides a minimum Hamming distance of T between instances of check data corresponding to error free payload data, where T is given by one of T=3 to provide single error correction capability and T=4 to provide single error correction and double error detection capability, said above method steps are implemented on an integrated circuit.

* * * * *